(12) United States Patent
Liang

(10) Patent No.: US 9,207,371 B2
(45) Date of Patent: Dec. 8, 2015

(54) SOLAR CONCENTRATOR

(71) Applicant: NATIONAL CENTRAL UNIVERSITY, Jhongli, Taoyuan County (TW)

(72) Inventor: Chao-Wen Liang, Taichung (TW)

(73) Assignee: NATIONAL CENTRAL UNIVERSITY, Jhongli, Taoyuan County (TW)

( * ) Notice: Subject to any disclaimer, the term of this patent is extended or adjusted under 35 U.S.C. 154(b) by 479 days.

(21) Appl. No.: 13/711,071

(22) Filed: Dec. 11, 2012

(65) Prior Publication Data

US 2013/0314811 A1 Nov. 28, 2013

(30) Foreign Application Priority Data

May 25, 2012 (TW) .............................. 101118793 A

(51) Int. Cl.
| | |
|---|---|
| *G02B 5/10* | (2006.01) |
| *F24J 2/18* | (2006.01) |
| *G02B 19/00* | (2006.01) |
| *H01L 31/054* | (2014.01) |

(52) U.S. Cl.
CPC ... *G02B 5/10* (2013.01); *F24J 2/18* (2013.01); *G02B 19/0028* (2013.01); *G02B 19/0042* (2013.01); *H01L 31/0543* (2014.12); *H01L 31/0547* (2014.12); *Y02E 10/52* (2013.01)

(58) Field of Classification Search
None
See application file for complete search history.

(56) References Cited

U.S. PATENT DOCUMENTS

| | | | |
|---|---|---|---|
| 5,180,441 A | 1/1993 | Cornwall et al. | |
| 5,344,496 A * | 9/1994 | Stern et al. | ..................... 136/246 |
| 7,391,939 B1 * | 6/2008 | Williams | ........................ 385/31 |

FOREIGN PATENT DOCUMENTS

| | | |
|---|---|---|
| CN | 101430419 A | 5/2009 |
| CN | 101726843 A | 6/2010 |
| CN | 101860271 A | 10/2010 |
| TW | 201024825 A1 | 7/2010 |

* cited by examiner

*Primary Examiner* — Jennifer L. Doak
(74) *Attorney, Agent, or Firm* — Muncy, Geissler, Olds & Lowe, P.C.

(57) ABSTRACT

A solar concentrator is composed of the cascading of the first light guiding module and a second light guiding module. The solar light is collected and guided simultaneously toward the light propagation destination by the light guiding modules. By cascading the light guiding modules in the direction of guiding, the solar concentrator has thinner thickness than the traditional concentrator and has a zero back focal distance to reduce the assembly cost. The solar concentrator utilizes the optical design concept of coincident image points from both the relay and converging optics such that the optical flux is increased in the cascading light guiding modules while the light propagation direction within the concentrator is maintained.

14 Claims, 11 Drawing Sheets

SOLAR CONCENTRATOR

CROSS REFERENCE TO RELATED APPLICATIONS

This Non-provisional application claims priority under 35 U.S.C. §119(a) on Patent Application No(s). 101118793 filed in Taiwan, Republic of China on May 25, 2012, the entire contents of which are hereby incorporated by reference.

BACKGROUND OF THE INVENTION

1. Field of Invention

The invention relates to a design of a solar concentrator which concentrates the solar light into a region for energy generation.

2. Related Art

Because the natural resources, such as the oil, coal and the like, are gradually depleted, the number of researches and development projects relating to solar energy applications are growing more rapidly than ever. However, the solar energy technology still has some drawbacks, such as the relatively lower energy conversion efficiency and the higher cost compared with the other conventional energy generation methods. So, it is an important goal to increase the utilization efficiency of the solar energy and decrease the solar energy per watt cost.

In order to enhance the solar utilization efficiency, it is proposed to use a solar concentrator combined with a light guide module, in which the sunlight is guided by the guiding element and conducted to the solar cell or heat conducting element to increase the solar energy collection efficiency, and thus to enhance the efficiency of the solar energy conversion device. The conventional concentrated solar energy conversion system uses the solar concentrator to converge the incident sunlight to a focused spot where the solar cell is placed nearby to absorb most energy with a smaller solar cell area to reduce the cost thereof. However, the long back focal distance of the concentrating optics increases the requirement of space volume of the conventional concentrated solar energy conversion device, thereby increasing the overall system weight and wind loading force. Therefore, the back focal distance of the solar concentrator not only increases the system space volume and the costs, but also causes the larger mounting area, and the solar energy conversion device needs the precise movement and control of the solar tracking.

Therefore, it is an important subject to provide a solar concentrator, which is advantageously thin so that the solar concentrator has the zero back focal distance and is adapted to various applications.

SUMMARY OF THE INVENTION

In view of the foregoing subject, an object of the invention is to provide a solar concentrator, which is advantageously thin and zero back focal distance so that the solar concentrator has the reduced solar tracking cost and can be adapted to various applications with limited space requirement.

To achieve the above objective, the present invention discloses a solar concentrator having a first side and a second side disposed opposite the first side and including a first light guiding module and a second light guiding module. The first light guiding module has a first surface, a first reflective surface and a first relay reflective surface, and the second light guiding module has a second surface, a second reflective surface and a second relay reflective surface. The first surface and the first relay reflective surface are positioned on the first side, and the first reflective surface is positioned on the second side. The second surface and the second relay reflective surface are positioned on the first side, and the second reflective surface is positioned on the second side. Herein, after light is incident through the first surface of the first light guiding module, the light is reflected by the first reflective surface and transferred in the first light guiding module, and then reflected to the second light guiding module by the first relay reflective surface.

In one embodiment, an extension convergence point of the light leaving the second surface and an extension convergence point of the light leaving the first relay reflective surface are substantially coincident.

In one embodiment, an extension convergence point of the light leaving the second surface and an extension convergence point of the light leaving the first relay reflective surface are substantially coincident, and an allowable error distance between the extension convergence point of the light leaving the second surface and the extension convergence point of the light leaving the first relay reflective surface is d, a distance between the second surface and the extension convergence point of the light leaving the second surface is $L_1$, a distance between the first relay reflective surface and the extension convergence point of the light leaving the first relay reflective surface is $L_2$, and the following inequality is satisfied:

$$|d| < \left|\frac{L_1 + L_2}{10}\right|.$$

In one embodiment, the first light guiding module and the second light guiding module are disposed side by side. Preferably, the first light guiding module and the second light guiding module are disposed side by side in a direction substantially parallel to a main direction, in which the light is guided.

In one embodiment, the first light guiding module and the second light guiding module are arranged in concentric circles, and the light is mainly guided to the center of the concentric circles.

In one embodiment, the light, reflected by the first relay reflective surface, travels to the second reflective surface of the second light guiding module.

In one embodiment, the light becomes parallel light after being reflected by the first relay reflective surface and travels in a direction substantially parallel to a traveling direction of the light transmitting through the first surface or the second surface.

In one embodiment, the first surface and/or the second surface is a plane, a convex, a concave or a wedged surface. To be noted, the convex or the concave mentioned in the specification is defined according to the point of view of the light contacting the surface with respect to the light traveling path rather than the exterior appearance of the light guiding module.

In one embodiment, the first reflective surface and/or the second reflective surface and the first relay reflective surface and/or the second relay reflective surface are aspheric surfaces or free form optical surfaces.

In one embodiment, the shapes of the first light guiding module and/or the second light guiding module are annular, linear, or curved.

In one embodiment, the first light guiding module and the second light guiding module comprises a light-transparent material.

In one embodiment, the solar concentrator further comprises a termination module, which is connected with the first light guiding module or the second light guiding module. The termination module has a light propagation destination for accommodating an opto-electronic conversion element or a heat transfer medium. The light propagation destination is positioned on the first side, on the second side, or between the first side and the second side.

In one embodiment, the first light guiding module and the second light guiding module form a guiding body, and the first side and the second side are positioned on two opposite sides of the guiding body.

In one embodiment, the solar concentrator further comprises a first lens and a second lens disposed opposite the first lens. The first lens comprises the first side, the first surface, the second surface, the first relay reflective surface and the second relay reflective surface, and the second lens comprises the second side, the first reflective surface and the second reflective surface.

In one embodiment, the solar concentrator further comprises at least one light convergence element disposed on the first side. The light is converged to the first surface and the second surface through the light convergence element, and the light convergence element adjusts the passed light to keep an image point of the second surface and an image point of the first relay reflective surface substantially coincident.

In one embodiment, the first surface, the second surface, the first reflective surface, the second reflective surface, the first relay reflective surface and the second relay reflective surface are curved surfaces, Fresnel surfaces or diffractive surfaces.

In one embodiment, the first surface, the second surface, the first reflective surface, the second reflective surface, the first relay reflective surface and the second relay reflective surface are total internal reflection surfaces or optical high reflective surfaces.

In summary, the solar concentrator of the invention includes a plurality of light guiding modules, each of which is composed of a plurality of surfaces, reflective surfaces and relay reflective surfaces and is for guiding the light. In addition, by keeping the image point of the surface of the solar concentrator and the image point of the relay reflective surface of the previous light guiding module substantially coincident, the incident light can be not only guided but also precisely converged to a focus point. Compared with the prior art, the solar concentrator of the invention has zero back focal distance, so that the thickness of the overall solar utilization unit having solar concentrator is decreased, and the object of thinning the solar utilization unit is achieved. Consequently, not only the built cost of the solar utilization unit can be significantly decreased, but the sunlight utilization efficiency can be also increased. In addition, the thinner solar energy conversion device having the solar concentrator of the invention may be applied to various arrangement conditions or the restricted spaces.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
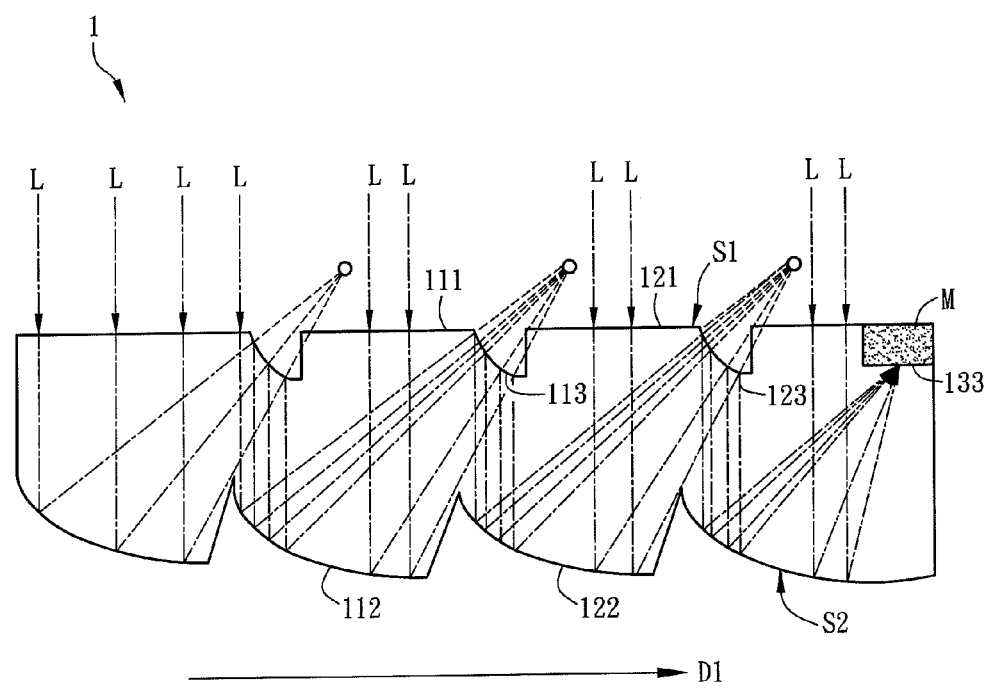
FIG. 1 is a schematically cross-sectional view showing a solar concentrator according to a first embodiment of the invention.
Figure 2A:
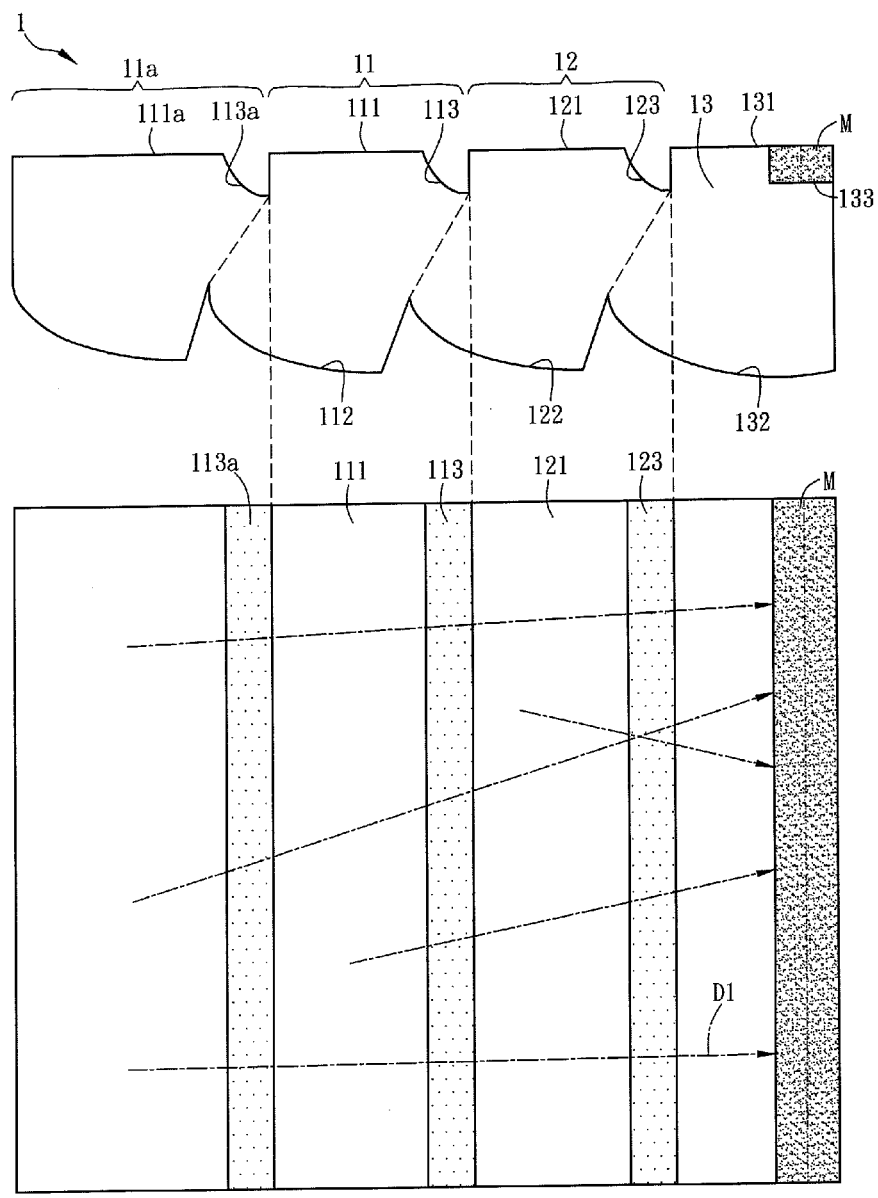
FIG. 2A shows top and cross-sectional views of the solar concentrator according to the first embodiment of the invention.

FIG. 1 is a schematically cross-sectional view showing a solar concentrator according to a first embodiment of the invention, and FIG. 2A shows top and cross-sectional views of the solar concentrator according to the first embodiment of the invention.

Figure 2B:
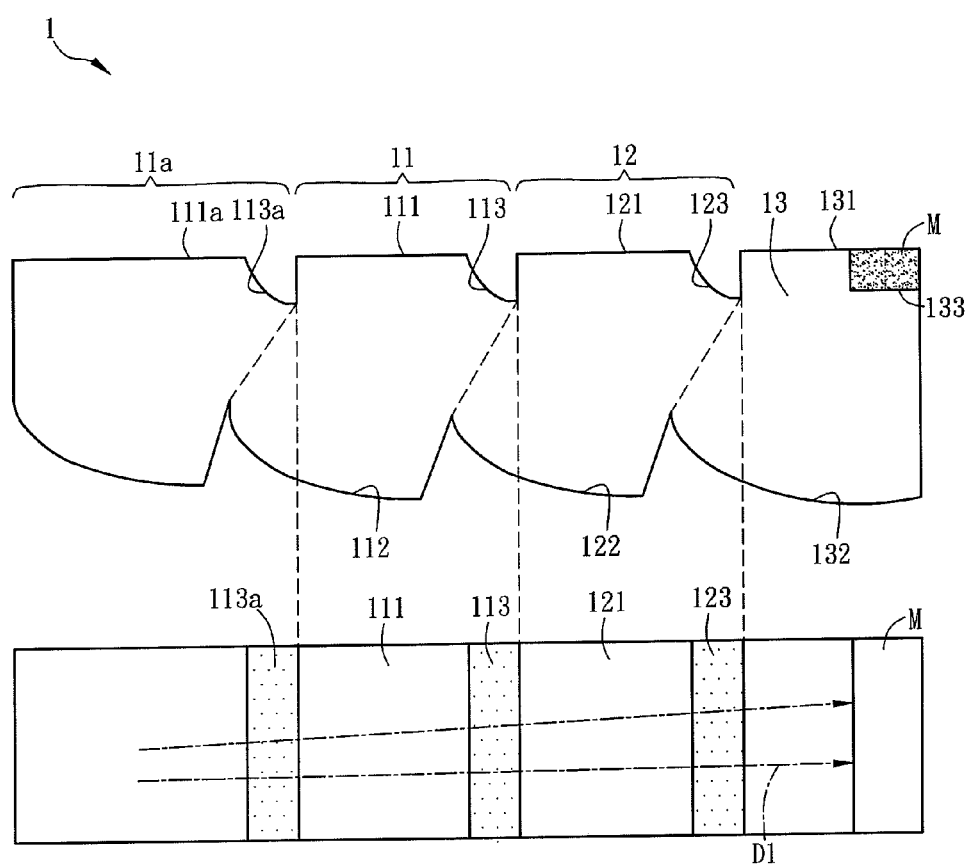
FIG. 2B shows top and cross-sectional views showing a solar concentrator according to a different aspect of the first embodiment of the invention.

Referring to FIGS. 1 and 2A, a solar concentrator 1 has a first side S1 and a second side S2 disposed opposite the first side S1. Herein, the sunlight incidents the solar concentrator 1 at the first side S1. So, the first side S1 is referred to as a light input side. The second side S2 disposed opposite the first side S1 is the shadow side without sunlight incidence. In the illustrated example, the solar concentrator 1 includes two first light guiding modules 11 and 11a and one second light guiding module 12. However, the numbers of the first light guiding module(s) 11 and the second light guiding module(s) 12 may be changed according to the actual requirement in order to fit the size of the solar concentrator 1. In addition, the solar concentrator 1 in this embodiment has a plate-like shape. Nevertheless, in another aspect, as shown in FIG. 2B, the top view of the solar concentrator 1 has a strip-like shape.

The first light guiding module 11 has a first surface 111, a first reflective surface 112 and a first relay reflective surface 113. The first surface 111 and the first relay reflective surface 113 are positioned on the first side S1. The first reflective surface 112 is positioned on the second side S2. The second light guiding module 12 has a second surface 121, a second reflective surface 122 and a second relay reflective surface 123. The second surface 121 and the second relay reflective surface 123 are positioned on the first side S1, and the second reflective surface 122 is positioned on the second side S2. Although the first light guiding module 11 and the second light guiding module 12 shown in FIGS. 1 and 2A have the same shape, the invention is not particularly restricted thereto. The first light guiding module 11 and the second light guiding module 12 may have completely different shapes, different sizes, and different curvatures. Such examples will be illustrated in the second and third embodiments. In addition, the first light guiding module 11 and the second light guiding module 12 are disposed side by side and are substantially parallel to each other, so that the solar concentrator 1 is in the slab shape. Also, the first light guiding module 11 and the second light guiding module 12 are disposed side by side in a direction substantially parallel to a main direction D1, in which the light L is guided. In addition, the materials of the first light guiding module 11 and the second light guiding module 12 may include a light-transparent material, such as glass, acrylic (Polymethylmethacrylate, PMMA), polyethylene terephthalate (PET), polycarbonate (PC) or any other light-transparent polymer material.

In the following, the optical path of the light inside the solar concentrator 1 will be discussed. The first light guiding module 11 and the second light guiding module 12 are determined according to the traveling order of the light. In other words, as shown in FIG. 1, the traveling order of the light through the light guiding module is from the light guiding module 11 to the light guiding module 12, so the light guiding module 11 may be regarded as the first light guiding module, while the light guiding module 12 may be regarded as the second light guiding module.

Referring simultaneously to FIGS. 1 and 2A, the light L (the arrows shown in FIG. 1) is incident to the solar concentrator 1 through the first surface 111 of the first light guiding module 11, reflected by the first reflective surface 112, propagates in the first light guiding module 11, reflected by the first relay reflective surface 113 to the second light guiding module 12, propagates inside the light guiding module 12, and then reflected by the second reflective surface 122 of the second light guiding module 12, as shown in FIG. 1 or 2A. In addition, the light L of this embodiment, after being reflected by the first relay reflective surface 113, may be collimated into the parallel light propagating to the second reflective surface 122. In addition, the direction of the parallel light is substantially parallel to the direction of the light L after incident through the first surface 111 or the second surface 121. In the theory of geometrical optics, the light, before being reflected or refracted by the optical surface, can be extended and focused as a point, which is referred to the object point of the optical surface. Similarly, the extension of the light after being reflected or refracted by the optical surface will focus to a point which is referred to as an image point of the optical surface. The image point of the second surface 121 and the image point of the first relay reflective surface 113 of the first light guiding module 11 are substantially coincident. Specifically, the light L is incident to the second surface 121 to form the parallel light and is converged and imaged at infinity; and the light L is incident to and reflected by the first relay reflective surface 113 to form the parallel light, which is also converged and imaged at infinity. So, the image points of both of them are substantially the same.

In the first embodiment, the solar concentrator 1 may further include another first light guiding module 11a. One end of the first light guiding module 11 is connected with the first light guiding module 11a, and the other end of the first light guiding module 11 is connected with the second light guiding module 12. The first light guiding module 11a may have the shape the same as or different from that of the first light guiding module 11 to facilitate the manufacturing process or to accommodate the optical design to increase the light input area of the light L. The image point of the first surface 111 and the image point of the first relay reflective surface 113a of the first light guiding module 11a are substantially coincident. In other words, light L incident to the first surface 111 is the parallel beam imaged at infinity; while the light L incident to and reflected by the first relay reflective surface 113a to is also a parallel beam imaged at infinity, so the image points of both surfaces 111 and 113a are substantially coincident at infinity.

In addition, the image point of the first relay reflective surface 113a are the object points of the first reflective surface 112, and the image point of the first reflective surface 112 in the first light guiding module 11 is the object point of the first relay reflective surface 113, which is imaged at infinity after being reflected by the first relay reflective surface 113, as mentioned hereinabove.

In addition to the first light guiding modules 11 and 11a and the second light guiding module 12, as shown in FIGS. 1 and 2A, the solar concentrator 1 may further include a termination module 13. The termination module 13 is the destination, to which the light L is finally guided, and may be disposed adjacent to the second light guiding module 12. The termination module 13 has a surface 131, a reflective surface 132 and a light propagation destination 133. Similarly, the image point of the surface 131 and the image point of the second relay reflective surface 123 are substantially coincident. The shape of the termination module 13 may be the same as or different from that of the first light guiding module 11 or the second light guiding module 12. In this example, the termination module 13 and the second light guiding module 12 have the similar shapes but the lateral side of the termination module 13 is rounded. The light propagation destination 133 is located at a portion of the reflective surface 132 of the termination module 13 for reflecting and converging the light. In other words, after the light L is incident to the surfaces of the first light guiding modules 11 and 11a and the second light guiding module 12, the light is successively transferred to the light propagation destination 133 in the termination module 13 in a main direction D1, in which the light is guided. The light propagation destination 133 may has an opto-electronic conversion element or a heat transfer medium, such as a solar cell or a heat pipe. In this example, the light propagation destination 133 is positioned at the first side S1 of the solar concentrator 1, and the light propagation destination 133 is has a solar cell M. In other aspects, multiple optical mirrors may be disposed inside the termination module 13, so the light propagation destination 133 can be positioned on the second side S2 of the solar concentrator 1 or between the first side S1 and the second side S2, and the light propagation destination 133 may have any other shape.

As shown in FIG. 2A, by disposing a plurality of first light guiding modules 11 and second light guiding modules 12, the incident light L may be transferred from one side of the solar concentrator 1 to the other side of the solar concentrator 1, and finally converged to the light propagation destination 133 in the termination module 13.

It is to be emphasized that, in this embodiment, each of the first surface 111 and the second surface 121 is a planar surface, each of the first reflective surface 112 and the second reflective surface 122 is a concave surface, and each of the first relay reflective surface 113 and the second relay reflective surface 123 is a convex surface. However, the invention is not restricted thereto, and the surface shapes may also have different variations. For example, the surface connections between the surfaces 111, 121 and 131 and the relay reflective surfaces 113a, 113 and 123 may be smoothly continuous or discontinuous with a gap. In practice, they can be formed in a single molding or assembled together. In addition, each of the first surface 111 and the second surface 121 is a convex surface, a concave surface or a wedge surface, and some or all of the first reflective surface 112, the second reflective surface 122, the first relay reflective surface 113, and the second relay reflective surface 123 may be an aspheric surface (e.g., a parabolic surface, a lenticular surface or a hyperbolic surface) or a free-form optical surface.

The first relay reflective surface 113, the second reflective surface 122, the second surface 121 can be any applicable optical surface as long as the image point of the second surface 121 and the image point of the first relay reflective surface 113 are substantially coincident. In practice, the corresponding types of the surfaces may be selected according to various optical design requirements. The similar principle may be applied analogically to the solar concentrator 1 having a plurality of first light guiding modules 11 or second light guiding modules 12. For example, when two first light guiding modules 11 and 11a are configured, the first relay reflective surface 113a, the first reflective surface 112 and the first surface 111 can be any applicable shape as long as the image point of one of the surfaces and the image point of the relay reflective surface of the previous light guiding module are configured to be substantially coincident. In addition, for the imaging purpose mentioned above, the optical surface z is described according to the following equation, where r denotes the lateral distance, and $a_0, a_1, a_2 \ldots a_n$ denote the aspheric coefficients:

$$z = a_0 + a_1 r + a_2 r^2 + a_3 r^3 + a_4 r^4 + a_5 r^5 + .$$

In general, the optical surface z can be least squared fitted by a spherical surface with the best fitted radius of curvature denoted by the R.

According to Gauss Equation, if the image points are coincident, the equations of $1/p + 1/q = 1/f$, and $R = 2f$ can be derived, where denotes the radius of curvature of the best fitted sphere of the optical surface, f denotes the focal length of the optical reflective surface in the optical path, p denotes the object distance to the optical surface, and q denotes the image distance to the optical surface.

In addition, because the light is blocked by the first relay reflective surface 113 and the second relay reflective surface 123, the areas of the first relay reflective surface 113 and the second relay reflective surface 123 are limited so that the light flux into the concentrator 1 area can be increased.

Furthermore, the first surface 111, the second surface 121, the first reflective surface 112, the second reflective surface 122, the first relay reflective surface 113 and the second relay reflective surface 123 may be curved surfaces, as shown in the drawing, or may be Fresnel surfaces or diffractive surfaces so that the thickness of the concentrator 1 can be decreased. The reflective surfaces can utilize total internal reflection to increase the reflectivity by increasing both the material refractive index and the incident angles of the light upon the reflective surface; otherwise, the material (e.g., gold, silver, aluminum, copper or the like) with high reflectivity may be disposed on the surfaces so that the surfaces become optical high reflective surfaces to enhance the effect of guiding the light L in the solar concentrator 1.

Figure 3A:
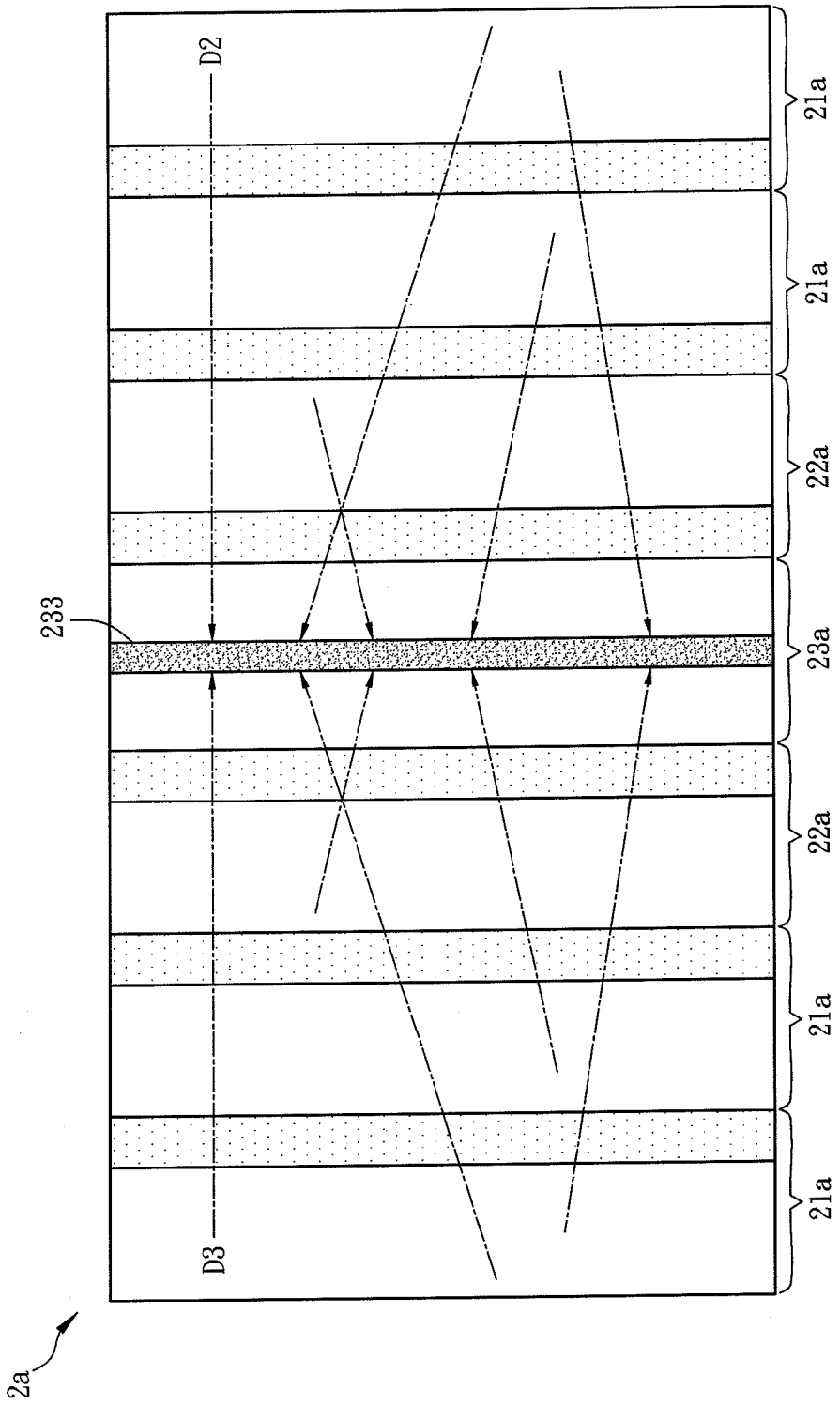
FIGS. 3A and 3B are top views showing solar concentrators according to different aspects of a second embodiment of the invention.
Figure 3B:
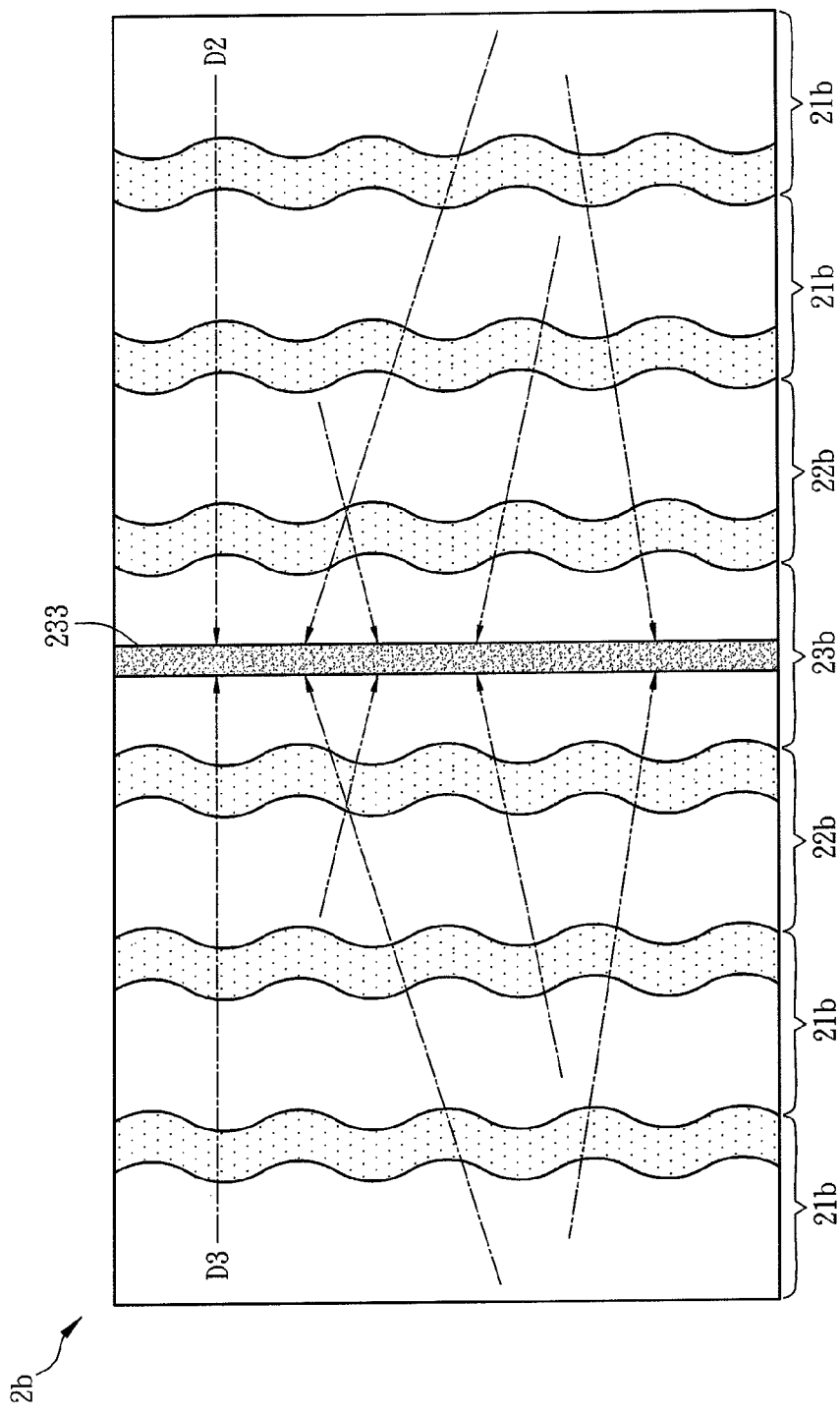

FIGS. 3A and 3B are top views showing solar concentrators according to a second embodiment of the invention.

As shown in FIGS. 3A and 3B, the solar concentrators 2a and 2b are substantially the same as the solar concentrator 1 of the first embodiment except that the solar concentrator 1 converges the light to a lateral side thereof, while each of the solar concentrators 2a and 2b converges the light to a middle portion thereof. The light propagation destinations 233 of the solar concentrators 2a and 2b are disposed at the middle portions of the solar concentrators 2a and 2b, respectively. The light propagation destination 233 and the termination module 23a and 23b are disposed at the middle as shown in FIG. 3A or 3B, and a plurality of first light guiding modules 21a and a second light guiding module 22a are disposed at each of the opposite sides of the middle termination module 23a in a symmetrical way. Therefore, each of the solar concentrators 2a and 2b has two main light guiding directions D2 and D3 pointing to the light propagation destination 233 of the termination module 23a or 23b. In FIG. 3A, the termination module 23a, the first light guiding modules 21a and the second light guiding module 22a have the straight line shapes and are arranged substantially parallel to one another. In FIG. 3B, the termination module 23b, the first light guiding modules 21b and the second light guiding module 22b of the solar concentrator 2b have the curved shapes and are also arranged substantially parallel to one another.

Figure 4:
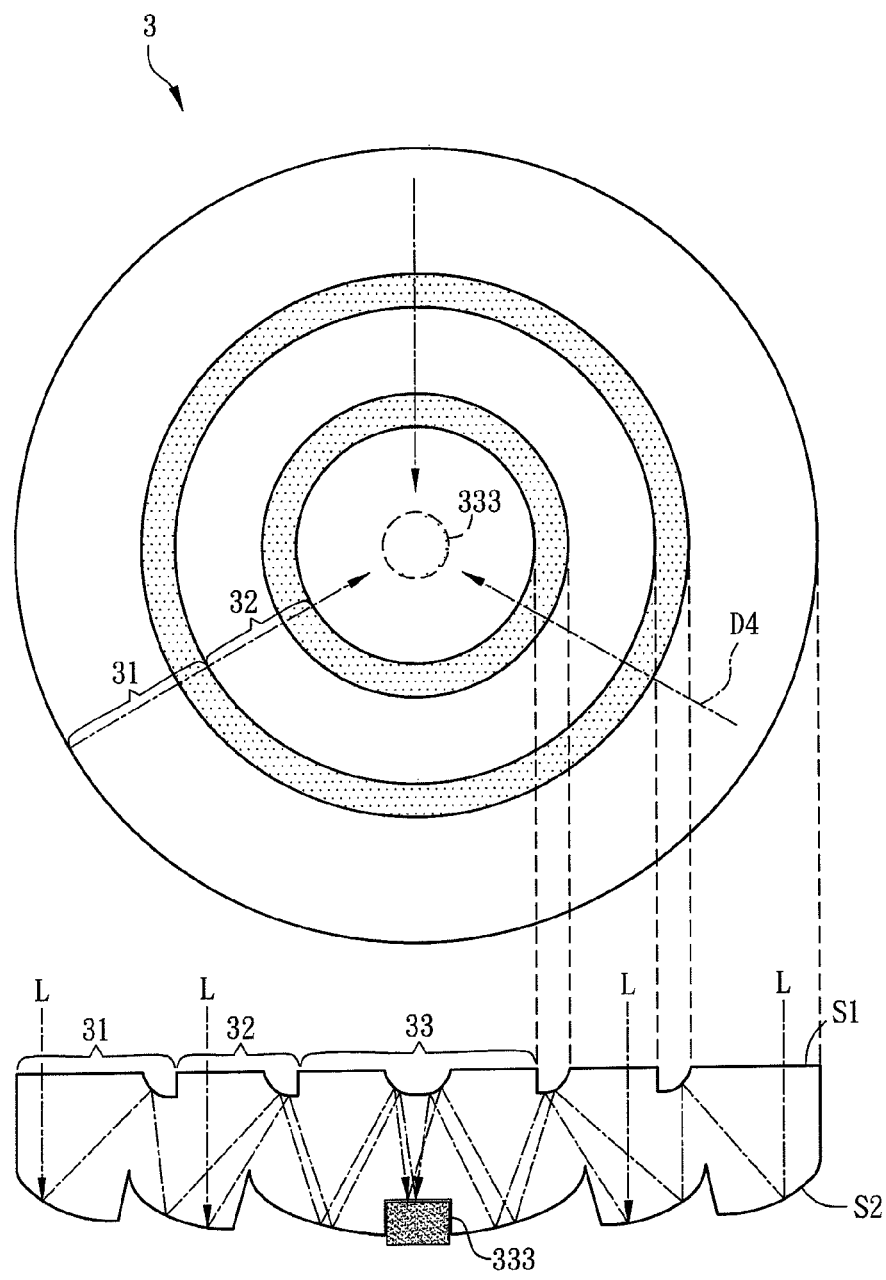
FIG. 4 shows top and cross-sectional views of a solar concentrator according to a third embodiment of the invention.

FIG. 4 shows top and cross-sectional views of a solar concentrator according to a third embodiment of the invention.

Referring to FIG. 4, the solar concentrator 3 is similar to the solar concentrator 1 of the first embodiment except that the first light guiding module 31 and the second light guiding module 32 of the solar concentrator 3 have the ring shapes and are arranged in concentric circles. The light L is mainly guided to the center of the concentric circles along the radial direction D4. An opto-electronic conversion element or a heat transfer medium is disposed in the light propagation destination 333 of the termination module 33 and it is positioned at the second side S2 of the solar concentrator 3 for a better wire connectivity and environmental shielding. Of course, the light propagation destination 333 may also be disposed on the first side S1.

Figure 5A:
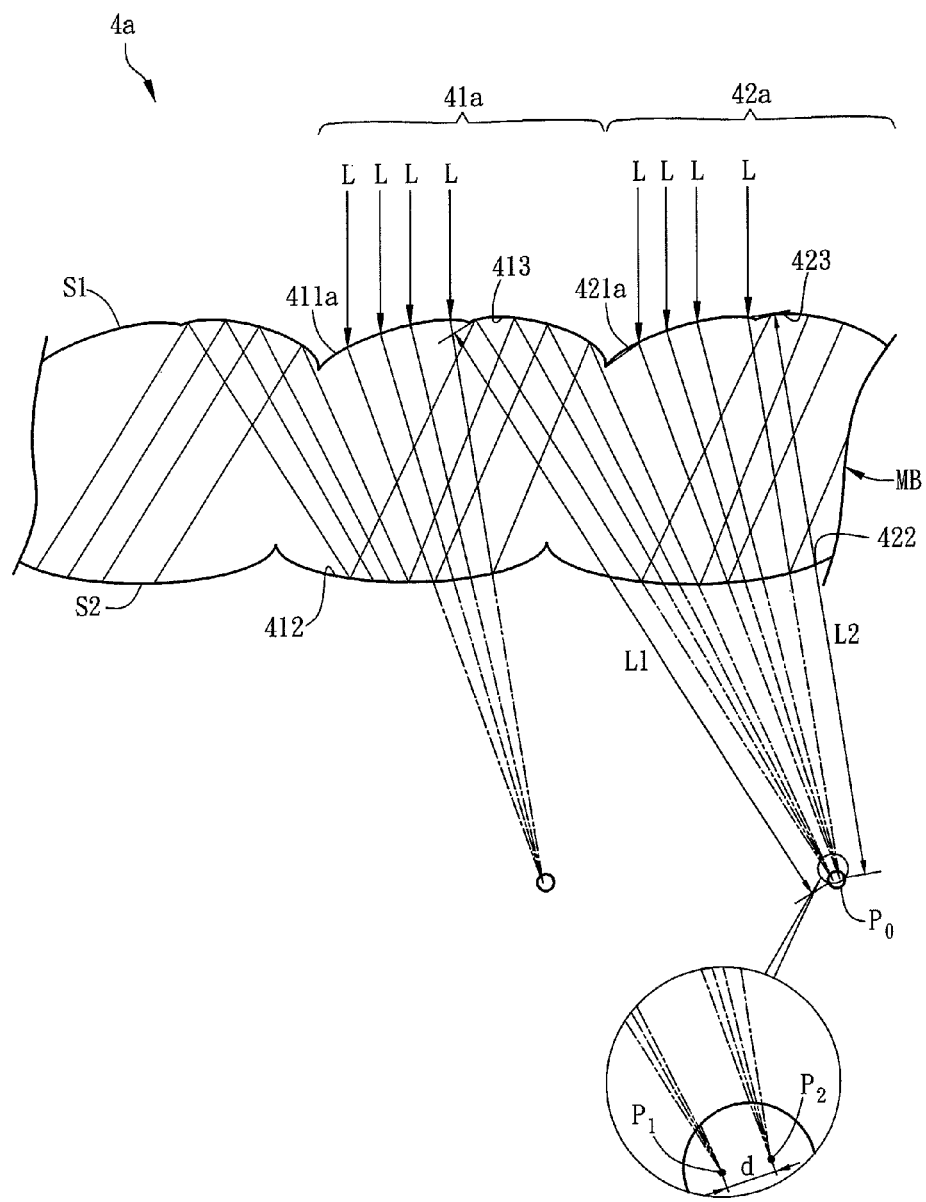
FIGS. 5A and 5B are partial cross-sectional views showing solar concentrators according to different aspects of a fourth embodiment of the invention, respectively.

FIG. 5A is a partial cross-sectional view showing a solar concentrator according to a fourth embodiment of the invention.

Referring to FIG. 5A, the solar concentrator 4a is similar to the solar concentrator 1 of the first embodiment except that each of the first surface 411a and the second surface 421a is a convex surface along the light propagation direction, and the first relay reflective surface 413 and the second relay reflective surface 423 are both concave surfaces. In addition, the curvatures of the first reflective surface 412 and the second reflective surface 422 may also be different from each other. It is to be noted that the concave or convex surface is defined according to the light propagation direction. Similar to the first embodiment, the image point of the second surface 421a and the image point of the first relay reflective surface 413 are substantially coincident. That is, the image point $P_0$ formed by the light L incident to the second surface 421a is the same as the image point $P_0$ formed by the light L reflected by the first relay reflective surface 413.

Referring to the magnified circle area of FIG. 5A, it is to be noted that "substantially coincident" allows some small tolerance errors due to design, assembly or fabrication. Thus, although a small distance d between the image point $P_1$ formed by the light L reflected by the first relay reflective surface 413 and the image point $P_2$ formed by the light L incident to the second surface 421a exists, the image points $P_1$ and $P_2$ are still said as "substantially coincident". According to geometrical optics depth of focus concept, we know that as long as the image point $P_1$ and the image point $P_2$ are considerably close to each other (i.e., the distance d falls within a predetermined error range), the distance d will not affect the guiding path of the light, and thus a coincident case may still be considered within the depth of focus. The absolute value of distance d within the allowable error range has to satisfy the following equation, $$|d| < \left| \frac{L_1 + L_2}{10} \right|,$$

wherein $L_1$ denotes the light traveling distance from the focused image point $P_1$ to the first relay reflective surface 413 of the optical surface, and $L_2$ denotes the light traveling distance from the focused image point $P_2$ and the second surface 421a of the optical surface.

Figure 5B:
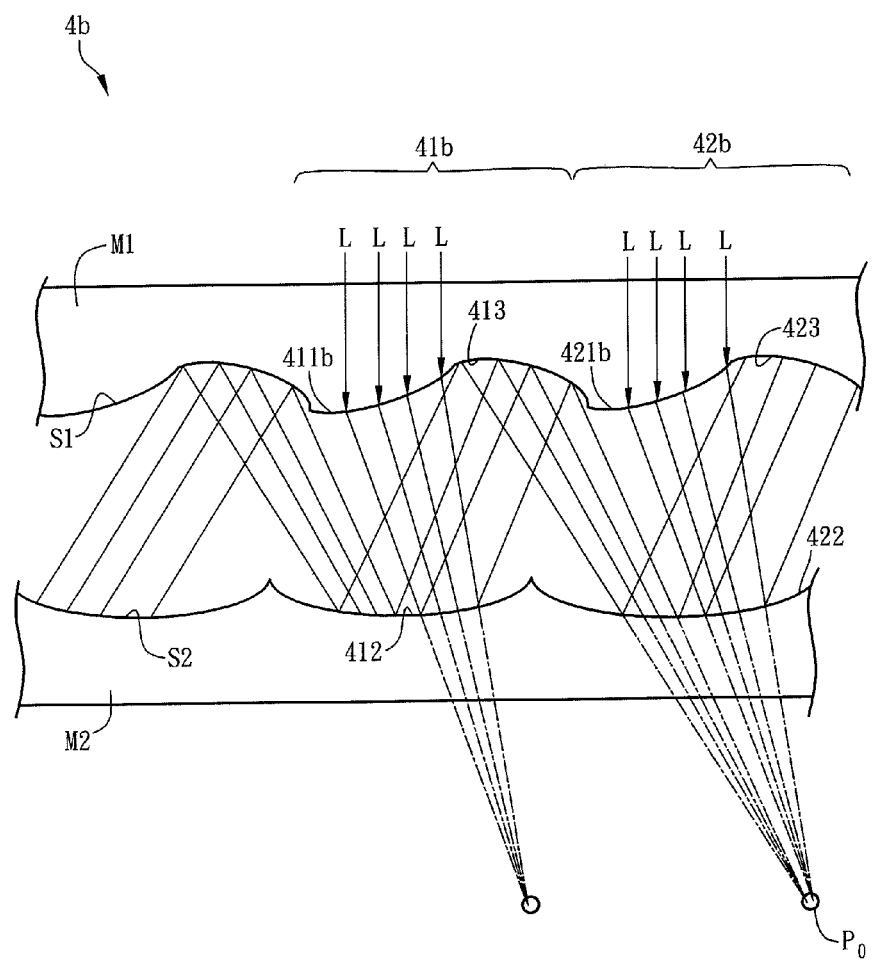

FIG. 5B is a partial cross-sectional view showing another solar concentrator according to another aspect of the fourth embodiment of the invention.

Referring to FIGS. 5A and 5B, the first light guiding module 41a and the second light guiding module 42a of the solar concentrator 4a of FIG. 5A form a guiding body MB, and the first side S1 and the second side S2 are positioned on two opposite sides of the guiding body MB. After being incident to the first surface 411a and the second surface 421a, the light L is guided and transferred in the guiding body MB. The guiding body MB may be composed of a light-transparent material, such as glass, acrylic (Polymethylmethacrylate, PMMA), polyethylene terephthalate (PET), polycarbonate (PC), or the like. Compared with FIG. 5A, the solar concentrator 4b of FIG. 5B has the optical surface structure substantially the same as that shown in FIG. 5A except that the solar concentrator 4b further includes a first lens M1 and a second lens M2. The first lens M1 includes the first side S1, a first surface 411b, a second surface 421b, a first relay reflective surface 413, and a second relay reflective surface 423. The second lens M2 includes the second side S2, the first reflective surface 412, and the second reflective surface 422. That is, the transfer medium for both the first light guiding module 41b and the second light guiding module 42b is air. The first light guiding module 41b and the second light guiding module 42b are composed of the first lens M1 and the second lens M2. After being incident to the first surface 411b and the second surface 421b, the light L is guided and transferred in the air between the first lens M1 and the second lens M2. The materials of each of the first lens M1 and the second lens M2 may be the light-transparent material, such as glass, acrylic, polyethylene terephthalate, polycarbonate or the like. Of course, by the same analogy, the light guiding module in each of the first to third embodiments may also be composed of two separate elements forming an air gap and the light is propagated and reflected between and through the two elements. As a result, the light propagation medium between the first and second light guiding modules could be air or solid transparent materials.

To be noted, both of the solar concentrator 4a and the solar concentrator 4b have the first relay reflective surface 413, the second relay reflective surface 423, the first reflective surface 412 and the second reflective surface 422. The difference between the solar concentrators 4b and 4a resides in that each of the first surface 411b and the second surface 421b of the solar concentrator 4b is a concave surface along the optical propagation path, so that the image point $P_0$ of the second surface 421b of the solar concentrator 4b and the image point $P_0$ of the first relay reflective surface 413 of the solar concentrator 4b are coincident, and the light L, after passing through the second surface 421b, has the coincident image point $P_0$ in the same way as that of FIG. 5A.

Figure 5C:
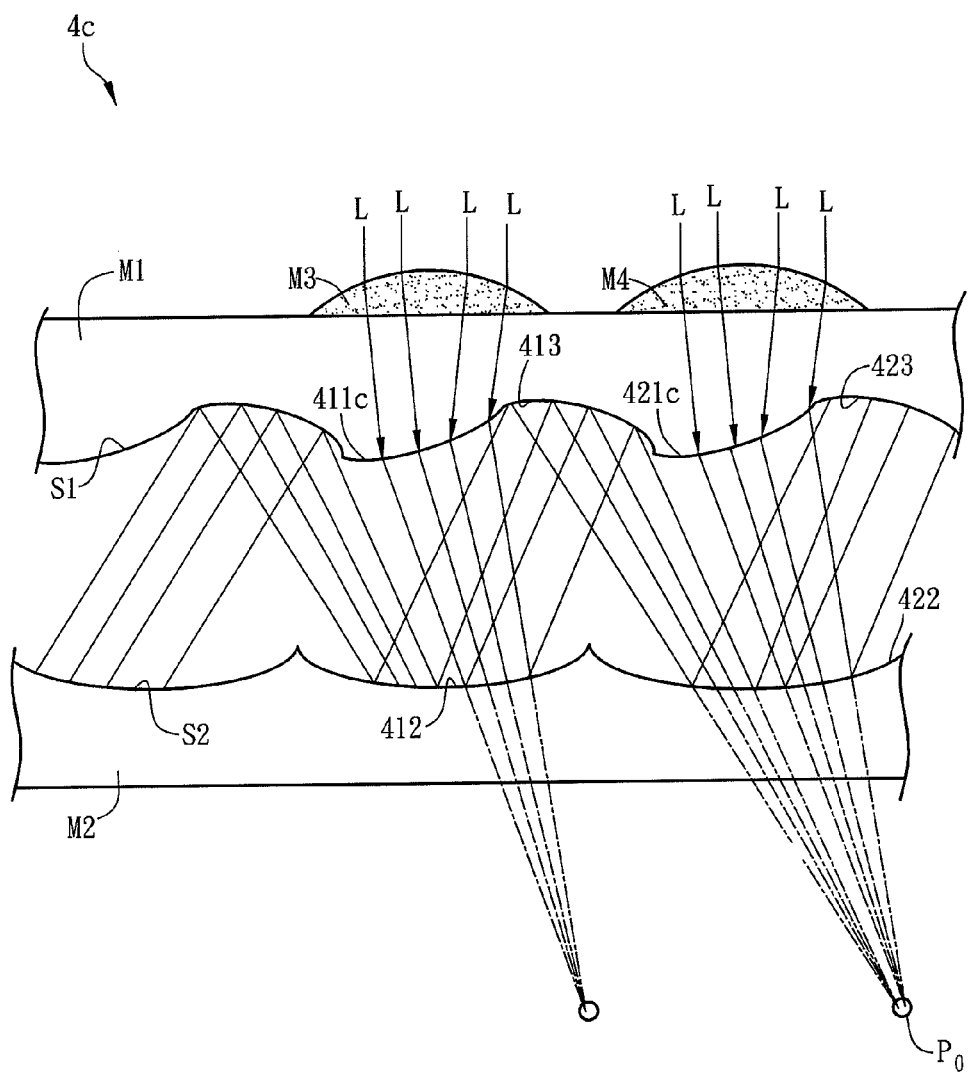
FIG. 5C is a partial cross-sectional view showing a solar concentrator according to another aspect of the fourth embodiment of the invention.

FIG. 5C is a partial cross-sectional view showing a solar concentrator according to another aspect of the fourth embodiment of the invention.

Compared with FIG. 5B, the solar concentrator 4c of FIG. 5C is substantially the same as the embodiment of FIG. 5B except for that the solar concentrator 4c further includes a third lens M3 and a fourth lens M4, which are disposed on the first lens M1. The third lens M3 and the fourth lens M4 are disposed on the first surface 411c and the second surface 421c, respectively, and concentrate the light incident to the first surface 411c and the second surface 421c, respectively. Then the concentrated light is incident from the first surface 411c and the second surface 421c to the solar concentrator 4c. Since the third lens M3 and fourth M4 can be designed to have larger incident area than the first surface 411a and second surface 421a, more light flux can incident into the concentrator 4c. Thus, the utilization efficiency of the incident light can further be enhanced so that the light concentrating efficiency of the solar concentrator 4c increases. The third lens M3 and the fourth lens M4 may be, for example but without limitation to, convex lenses, and may have the same shape or different shapes.

Figure 6A:
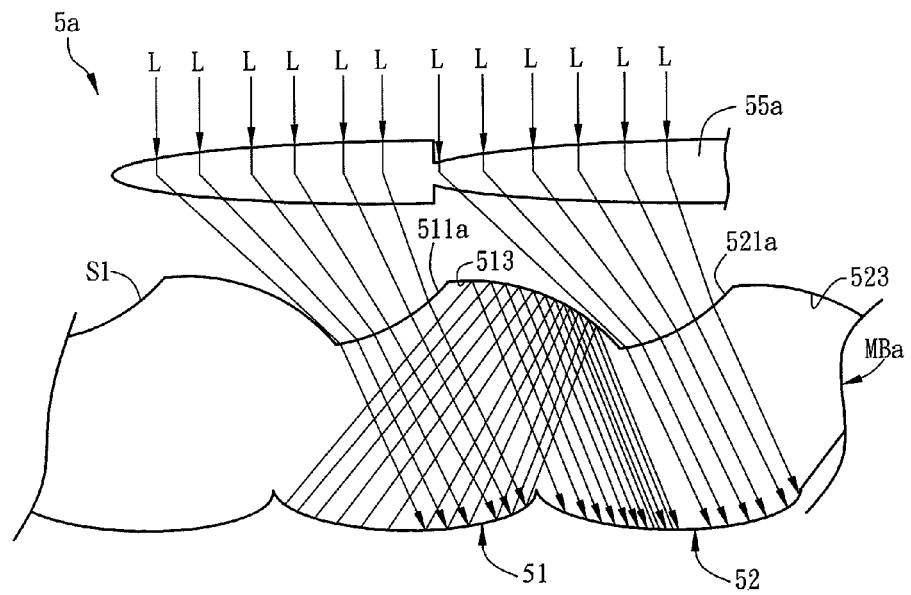
FIGS. 6A to 6C are partial cross-sectional views showing solar concentrators according to different aspects of a fifth embodiment of the invention, respectively.

FIG. 6A is a partial cross-sectional view showing a solar concentrator according to a fifth embodiment of the invention.

As shown in FIG. 6A, the solar concentrator 5a is similar to that of the embodiment of FIG. 5A except for that the solar concentrator 5a further includes at least one light convergence element 55a disposed on the first side S1 of the first light guiding module 51 and the second light guiding module 52. The light convergence element 55a has a plurality of focus points for converging the light L to the first surface 511a and the second surface 521a. The light convergence element 55a is configured to increase the light flux of the light L, to eliminate the reduction of the incident light flux by the first relay reflective surface 513 and the second relay reflective surface 523, and thus to increase the light utilization efficiency. Each of the first surface 511a and the second surface 521a is a concave surface, which diverges the light converged by the light convergence element 55a to keep the image point of the second surface 521a and the image point of the first relay reflective surface 513 substantially coincident. In this fifth embodiment, the image point thereof is located at infinity. But, the invention does not limit the image point thereof to be at infinity as just shown in the fourth embodiment.

The light convergence element 55a may be, for example but without limitation to, a parabolic reflector, a cubic reflector, a hyperbolic reflector, an elliptical reflector, a flat reflector, Cassegrain optics, Winston cone optics, a round reflector, a lens, hologram or a prismatic ridge, or the likes. As shown in FIG. 6A, a combination of two partial lenses of the light convergence element 55a is achieved by the manufacture molding process.

Figure 6B:
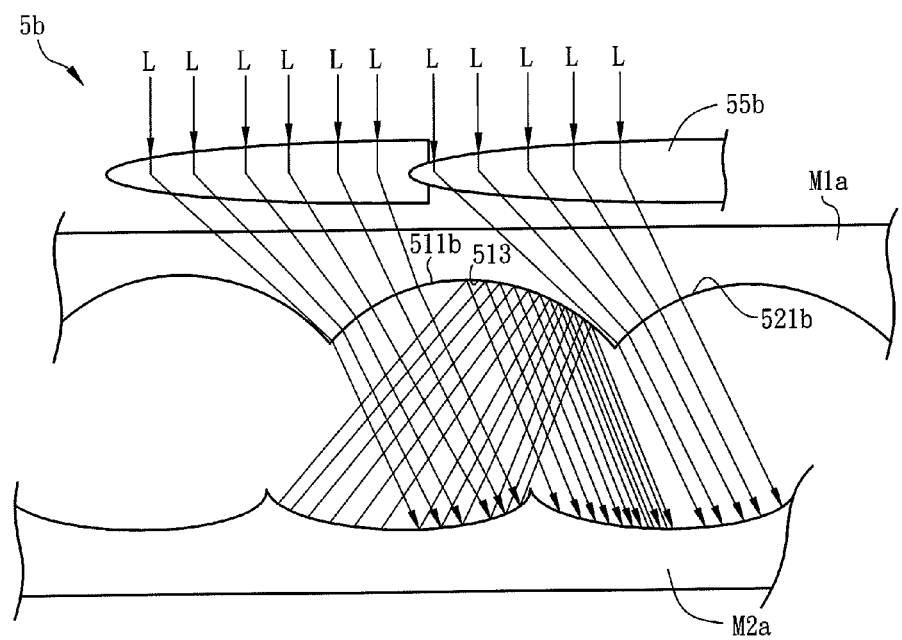

FIG. 6B is a partial cross-sectional view showing a solar concentrator according to another variation type of the fifth embodiment of the invention.

In addition, the difference between FIGS. 6A and 6B resides in that the solar concentrator 5a in FIG. 6A has a guiding body MBa for guiding and transferring the light L incident to the first surface 511a and the second surface 521a, but the solar concentrator 5b in FIG. 6B includes a first lens M1a and a second lens M2a disposed opposite each other, wherein the light L incident to the first surface 511b and the second surface 521b is guided and transferred in the air between the first lens M1a and the second lens M2a. The first surface 511b and the second surface 521b of the solar concentrator 5b are both convex surface, but the image point of the second surface 521b of the solar concentrator 5b and the image point of the first relay reflective surface 513 are still substantially coincident. The image point thereof is located at infinity. The light convergence element 55b in FIG. 6B is composed of two partial lenses connected together.

Figure 6C:
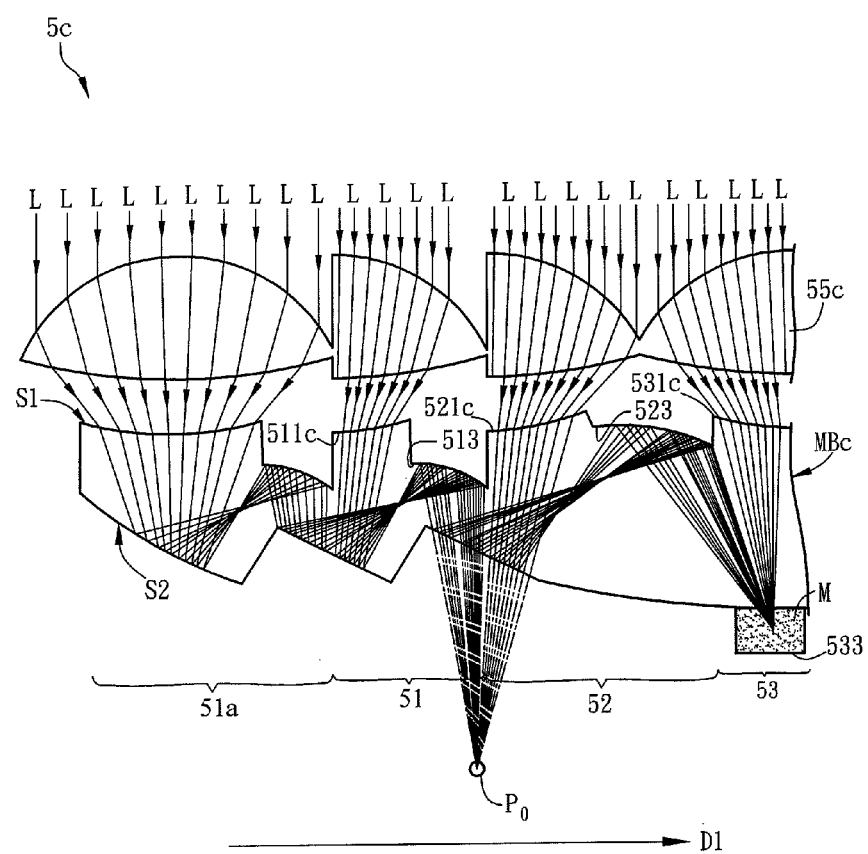

FIG. 6C is a partial cross-sectional view showing a solar concentrator according to another variation type of the fifth embodiment of the invention.

Referring to FIG. 6C, the solar concentrator 5c has a similar design to that of FIG. 6A. The light convergence element 55c of the solar concentrator 5c is disposed on the first side S1 of the first light guiding module 51 and the second light guiding module 52. The first light guiding module 51 and the second light guiding module 52 have different shapes and different sizes. In addition, the first surface 511c and the second surface 521c are both concave surfaces and have the corresponding light convergence element 55c on the first side 51 thereof. After passing through the convergence element 55c and consequently the first surface 511c or the second surface 521c, the image point of the light is designed to keep the image point of the second surface 521c and the image point of the first relay reflective surface 513 substantially coincident. As a result, with the degrees of design freedom, the first surface 511c and the second surface 521c are not restricted to the concave shape to keep the image points of second surface 521c and first relay reflective surface 513 being coincident. In addition, the light propagation destination 533 is disposed on the second side S2, and the light L incident to the surfaces of the first light guiding modules 51 and 51a and the second light guiding module 52 is then successively propagated in the main direction D1 to the light propagation destination 533. In the light propagation destination 533, the light can be absorbed by, for example, the solar cell M. In the example of FIG. 6C, four lenses of different surface shapes are combined to make the light convergence element 55c. In addition, the solar concentrator 5c may also have a plurality of light convergence elements 55c, which are stacked and disposed on the first sides S1 of the first light guiding module 51 and the second light guiding module 52. After the light L is refracted by the light convergence element 55c and the surface 531c consecutively, a portion of the incident light L may be focused into the light propagation destination 533 directly without entering the light guiding module 51 or 52. After the light is reflected by the second relay reflective surface 523, the incident light is also focused into the light propagation destination 533, and the two light converging points are substantially coincident at the light propagation destination 533.

In summary, the solar concentrator of the invention includes a plurality of light guiding modules, each of which is composed of a plurality of surfaces, reflective surfaces and relay reflective surfaces and is designed for guiding the light to a destination. In addition, by keeping the image point of the surface of the solar concentrator and the image point of the relay reflective surface of the previous light guiding module substantially coincident, the incident light is not only guided but also precisely converged to a focus point. Compared with the prior art, the solar concentrator of the invention has a zero focal distance, so that the thickness of the overall solar utilization unit having solar concentrator is decreased, and the object of thinning the solar utilization unit is achieved. Consequently, not only the built cost of the solar utilization unit can be significantly decreased, but the sunlight utilization efficiency can be also increased. In addition, the thinner solar energy conversion device having the solar concentrator of the invention may be applied to various arrangement conditions or the restricted spaces.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A solar concentrator having a first side and a second side disposed opposite the first side, the solar concentrator comprising:

a first light guiding module having a first surface, a first reflective surface and a first relay reflective surface, wherein the first surface and the first relay reflective surface are positioned on the first side, and the first reflective surface is positioned on the second side; and a second light guiding module having a second surface, a second reflective surface and a second relay reflective surface, wherein the second surface and the second relay reflective surface are positioned on the first side, and the second reflective surface is positioned on the second side, wherein after light is incident through the first surface of the first light guiding module, the light is reflected by the first reflective surface and transferred in the first light guiding module, and then reflected to the second light guiding module by the first relay reflective surface, wherein an extension convergence point of the light leaving the second surface and an extension convergence point of the light leaving the first relay reflective surface are substantially coincident, and an allowable error distance between the extension convergence point of the light leaving the second surface and the extension convergence point of the light leaving the first relay reflective surface is d, a distance between the second surface and the extension convergence point of the light leaving the second surface is L1, a distance between the first relay reflective surface and the extension convergence point of the light leaving the first relay reflective surface is L2, and the following inequality is satisfied:

$$|d| < \left| \frac{L_1 + L_2}{10} \right|.$$

2. The solar concentrator according to claim 1, wherein the first light guiding module and the second light guiding module are disposed side by side, or the first light guiding module and the second light guiding module are arranged in concentric circles.

3. The solar concentrator according to claim 2, wherein the first light guiding module and the second light guiding module are disposed side by side in a direction substantially parallel to a main direction, in which the light is guided.

4. The solar concentrator according to claim 1, wherein the light, reflected by the first relay reflective surface, travels to the second reflective surface of the second light guiding module.

5. The solar concentrator according to claim 1, wherein the light becomes parallel light after being reflected by the first relay reflective surface and travels in a direction substantially parallel to a traveling direction of the light transmitting through the first surface or the second surface.

6. The solar concentrator according to claim 1, wherein the first surface and/or the second surface is a plane, a convex, a concave or a wedged surface.

7. The solar concentrator according to claim 1, wherein the first reflective surface and/or the second reflective surface and the first relay reflective surface and/or the second relay reflective surface are aspheric surfaces or free form optical surfaces.

8. The solar concentrator according to claim 1, further comprising:

a termination module, which is connected with the first light guiding module or the second light guiding module, and has a light propagation destination for accommodating an opto-electronic conversion element or a heat transfer medium.

9. The solar concentrator according to claim 8, wherein the light propagation destination is positioned on the first side, on the second side, or between the first side and the second side.

10. The solar concentrator according to claim 1, wherein the first light guiding module and the second light guiding module form a guiding body, and the first side and the second side are positioned on two opposite sides of the guiding body.

11. The solar concentrator according to claim 1, further comprising:
a first lens and a second lens disposed opposite the first lens, wherein the first lens comprises the first side, the first surface, the second surface, the first relay reflective surface and the second relay reflective surface, and the second lens comprises the second side, the first reflective surface and the second reflective surface.

12. The solar concentrator according to claim 1, further comprising:
at least one light convergence element disposed on the first side, wherein the light is converged to the first surface and the second surface through the light convergence element, and the light convergence element adjusts the passed light to keep an image point of the second surface and an image point of the first relay reflective surface substantially coincident.

13. The solar concentrator according to claim 1, wherein the first surface, the second surface, the first reflective surface, the second reflective surface, the first relay reflective surface and the second relay reflective surface are curved surfaces, Fresnel surfaces or diffractive surfaces.

14. The solar concentrator according to claim 1, wherein the first surface, the second surface, the first reflective surface, the second reflective surface, the first relay reflective surface and the second relay reflective surface are total internal reflection surfaces or optical high reflective surfaces.

* * * * *